United States Patent [19]

Misheloff et al.

[11] Patent Number: 5,461,579
[45] Date of Patent: Oct. 24, 1995

[54] EXTRACTION METHOD FOR AUTOMATED DETERMINATION OF SOURCE/DRAIN RESISTANCE

[75] Inventors: Michael N. Misheloff, Dublin; Balaji Krishnamachary, Fremont; Osman E. Akcasu, San Jose, all of Calif.

[73] Assignee: VLSI Technology, Inc., San Jose, Calif.

[21] Appl. No.: 241,268

[22] Filed: May 11, 1994

[51] Int. Cl.[6] .................................................. H01L 21/82
[52] U.S. Cl. ........................... 364/491; 364/490; 364/578
[58] Field of Search ..................................... 364/488, 489, 364/490, 491, 578; 371/23; 357/23.1; 330/302

[56] References Cited

U.S. PATENT DOCUMENTS

| | | | |
|---|---|---|---|
| 4,868,825 | 9/1989 | Koeppe | 371/23 |
| 4,907,053 | 3/1990 | Ohmi | 357/23.1 |
| 4,907,180 | 3/1990 | Smith | 364/578 |
| 4,939,681 | 7/1990 | Yokomizo et al. | 364/578 |
| 5,021,843 | 7/1991 | Ohmi | 357/23.1 |
| 5,210,699 | 5/1993 | Harrington | 364/488 |
| 5,282,148 | 1/1994 | Poirot et al. | 364/491 |
| 5,345,401 | 9/1994 | Tani | 364/578 |
| 5,349,539 | 9/1994 | Moiryasu | 364/578 |
| 5,361,043 | 11/1994 | Shimotashiro et al. | 330/302 |

OTHER PUBLICATIONS

"Resistance Extraction in a Hierarchical IC Artwork Verification System", by S. Mori, IEEE, CH2233-5, pp. 196–198.

G. Yokomizo, A. Yajima, Y. Okamura, T. Sato, *HICE: Hierarchical Circuit Extraction System for Layout Verification*, Proceedings of the IEEE Custom Integrated Circuits Conference, 1987, pp. 133–136.

Y. Okamura, Y. Muraishi, T. Sato, and Y. Ikemoto, *LAS: Layout Pattern Analysis System with New Approach*, ICCC, 1982, pp. 308–311.

*Primary Examiner*—Kevin J. Teska
*Assistant Examiner*—Russell W. Frejd
*Attorney, Agent, or Firm*—Douglas L. Weller

[57] ABSTRACT

A method estimates source resistance for a transistor. A substrate region under a gate for the transistor is modeled as a gate region having a uniform resistivity $\rho_g$. A source of the transistor is modeled as a source region having a uniform resistivity $\rho_{s1}$. The uniform resistivity $\rho_g$ and the uniform resistivity $\rho_{s1}$ are used to calculate a first current from the source of the transistor to a drain of the transistor. The source of the transistor is then modeled as a source region having another uniform resistivity $\rho_{s2}$. The uniform resistivity $\rho_{s2}$, is different in value than uniform resistivity $\rho_{s1}$. The uniform resistivity $\rho_g$ and the uniform resistivity $\rho_{s2}$ are used to calculate a second current from the source of the transistor to a drain of the transistor. The uniform resistivity $\rho_{s1}$, the uniform resistivity $\rho_{s2}$, the first current and the second current are used to calculate the source resistance for the transistor.

19 Claims, 4 Drawing Sheets

EXTRACTION METHOD FOR AUTOMATED DETERMINATION OF SOURCE/DRAIN RESISTANCE

BACKGROUND

The present invention concerns netlist extraction during layout design of an integrated circuit. Particularly, the present invention pertains to automated extraction of source and drain resistance for transistors used in the integrated circuit.

In the course of the design of very large scale integrated (VLSI) circuits it is desirable to perform circuit characterization to determine circuit performance. The characterization of VLSI circuits is heavily dependent on parasitic resistance and parasitic capacitance. A circuit extraction system, (also called a netlist extractor) is used to extract from a circuit design particular circuits to be simulated. The extraction includes not only the circuitry, but also the parasitic capacitance and parasitic resistance inherent in circuit components.

In the past, various methods have been used to determine parasitic resistance for the source and drain. For example, in one prior art system, gate resistivity is assumed to be five to ten times the source/drain resistivity. The gate region and the source drain regions are broken up into about twenty pieces. Resistance is calculated for each piece and a resistance mesh is formed. A voltage is applied across the two ends of the mesh and the resulting current obtained. The total resistance is calculated by dividing the applied voltage by the resulting current. The source/drain region resistance is determined by subtracting out the gate resistance from the total resistance. See G. Yokomizo, A. Yajima, Y. Okamura, T. Sato, *HICE; Hierarchical Circuit Extraction System for Layout Verification, Proceedings of the IEEE Custom Integrated Circuits Conference,* 1987, pp. 133–136. This system assumes a fixed gate resistivity independent of the layout. Further, this solution neglects two dimensional effects by assuming current flow in a region to be one dimensional.

In another prior art system, a technique is used to calculate the distributed resistance of multi-regional arbitrary geometries. The technique makes use of an extended complex potential method. See Y. Okamura, Y. Muraishi, T. Sato, and Y. Ikemoto, *LAS: Layout Pattern Analysis System with New Approach, ICCC,* 1982, pp. 308–311. This system solves Laplace's equation numerically, however, this is not done with a standard numerical technique, e.g., finite element or finite difference. Also the equations used are solved for the case of a single fixed gate resistivity independent of layout.

SUMMARY OF THE INVENTION

In accordance with the preferred embodiment of the present invention, a method is presented for estimating source/drain resistance for a transistor. As is understood by persons of ordinary skill in the art, for a transistor, the source and the drain regions are arbitrarily defined and may be interchanged. Thus, in the Summary of the Invention and the Claims, when reference is directed to the "source" of a transistor, it may be understood that the reference applies equally to the "drain" of a transistor.

A substrate region under a gate for the transistor is modeled as a gate region having a uniform resistivity $\rho_g$. A source of the transistor is modeled as a source region having a uniform resistivity $\rho_{s1}$. The uniform resistivity $\rho_g$ and the uniform resistivity $\rho_{s1}$ are used to calculate a first current from the source of the transistor to a drain of the transistor. For example, the first current is calculated using Laplace's equation.

The source of the transistor is modeled as a source region having a uniform resistivity $\rho_{s2}$. The uniform resistivity $\rho_{s2}$, is different in value than uniform resistivity $\rho_{s1}$. The uniform resistivity $\rho_g$ and the uniform resistivity $\rho_{s2}$ are used to calculate a second current from the source of the transistor to a drain of the transistor. For example, the second current is calculated using Laplace's equation.

The uniform resistivity $\rho_{s1}$, the uniform resistivity $\rho_{s2}$, the first current and the second current are used to calculate the source resistance for the transistor. For example, this may be done using a form of the following equation:

$$R_s = \frac{\frac{V}{I_1} - \frac{V}{I_2}}{\rho_{s1} - \rho_{s2}} \rho_{s1}.$$

In the preferred embodiment of the present invention, The value for uniform resistivity $\rho_g$ is obtained as follows. An initial value of uniform resistivity $\rho_g$ is selected. The initially selected value of uniform resistivity $\rho_g$ is used to calculate the minimum voltage drop across the gate region. When the calculated voltage drop across the gate region is not within a predetermined range, a new value for the uniform resistivity $\rho_g$ is calculated. This is repeated until the uniform resistivity $\rho_g$ used to calculate the minimum voltage drop across the gate region results in the calculated voltage drop across the gate region being within the predetermined range. For example, the new value for the uniform resistivity (new $\rho_g$) is calculated from the value for the initially selected uniform resistivity $\rho_g$, from the minimum voltage drop ($V_g$) across the gate region and from a target voltage ($V_{targ}$) within the predetermined range using the following equation:

$$\text{new } \rho_g = \rho_g \frac{V_{targ}}{V_g}.$$

The present invention allows for a fairly accurate and efficient means for determining source resistance of a transistor.

DESCRIPTION OF THE PREFERRED EMBODIMENT

Figure 1:
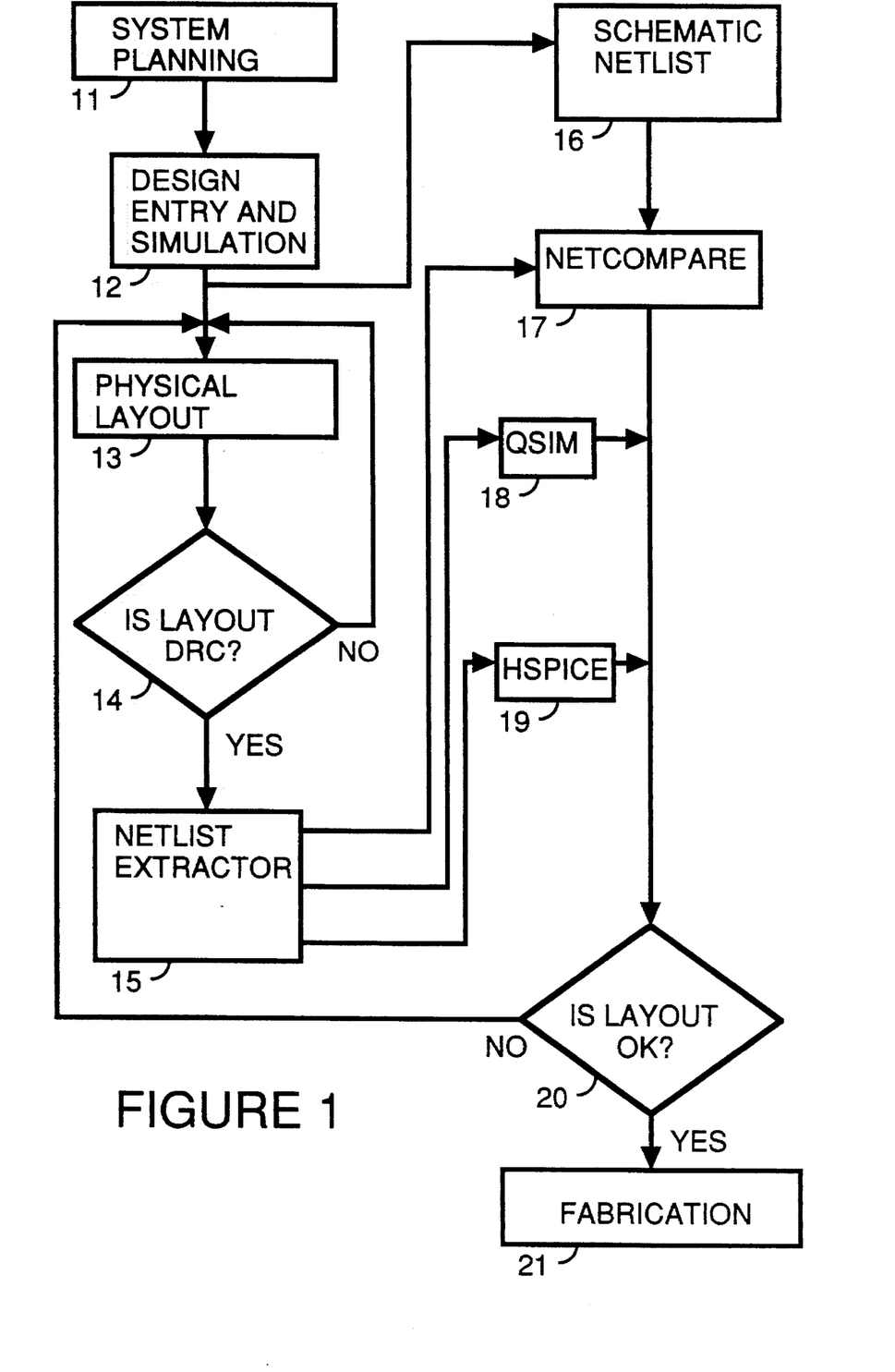
FIG. 1 shows a block diagram for design flow for producing a VLSI circuit.

FIG. 1 shows design flow for a VLSI circuit. In a system planning phase 11, a designer plans the system. In a design entry and simulation phase 12, the designer produces a schematic netlist 16 and a physical layout 13 of the circuit to be fabricated. Various commercially available products may be used to produce the schematic representation. For example, the schematic representation may be produced using LogicAssistant, available from Compass Design Automation having a business address of 1865 Lundy Avenue, San Jose, Calif. 95131.

Schematic netlist 16 is a schematic representation of the circuit. Physical layout 13 is a mask description.

In a phase 14, a design rule checker is used to check the mask description against a set of design criteria for the anticipated manufacturing process. For example, the mask description may be checked using Design Rule Checker (DRC) also available from Compass Design Automation. If the design rule checker determines that the mask description does not conform to the design criteria, modifications are made in physical layout 13 to produce a mask description which does conform to the design criteria.

A netlist extractor 15 is used to extract the netlist information from physical layout 13. For example, netlist compare software 17 is used to compare the entire netlist extracted from the physical layout 13 with schematic netlist 16. The netlist compare may be performed, for example, by NetCompare available from Compass Design Automation.

Also, logic simulation 18 may be performed to ensure that functionality and timing is maintained. For example, simulation may be performed using QSIM available from Compass Design Automation.

Additionally, SPICE simulations 19 may be performed on various components of the device to ensure that performance criteria are met. HSPICE is such a product and is available from META-SOFTWARE Company, having a business address of 1300 White Oak Road, Campbell, Calif. 95008.

A determination 20 is made whether the performance/functionality of the device is acceptable. If not, modifications are made in physical layout 13 to produce a device which will be acceptable. When the performance/functionality of the device is acceptable, the circuit is ultimately fabricated in a fabrication phase 21.

It is desirable to make an accurate determination of parasitic resistances within circuitry by netlist extractor 15.

Figure 2:
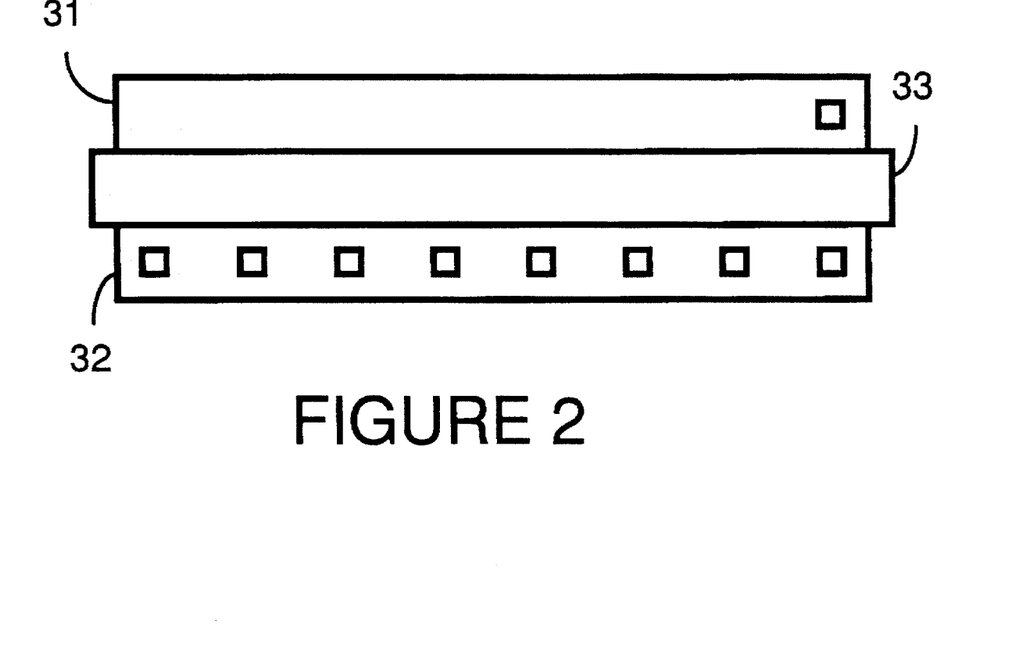
FIG. 2 and FIG. 3 show a transistor circuit within a VLSI circuit design.
Figure 3:
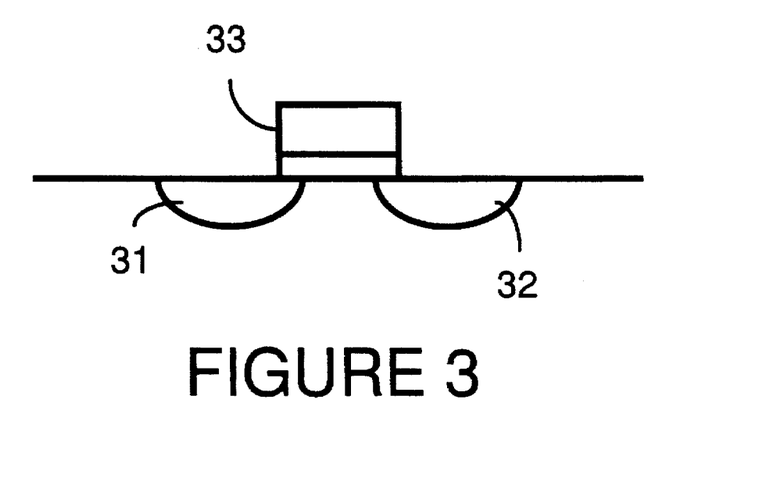

For example, FIG. 2 shows a transistor having a source region 31, a gate region 33 and a drain region 32. As will be understood by persons of ordinary skill in the art, FIG. 3 shows a cross-section of the transistor shown in FIG. 2.

The resistance through source region 31 and the resistance through drain region 32 are both calculated using the same method. Therefore, the following discusses determination of the resistance through source region 31 with the understanding that the method may then be repeated to find the resistance through drain regions 32.

Figure 4:
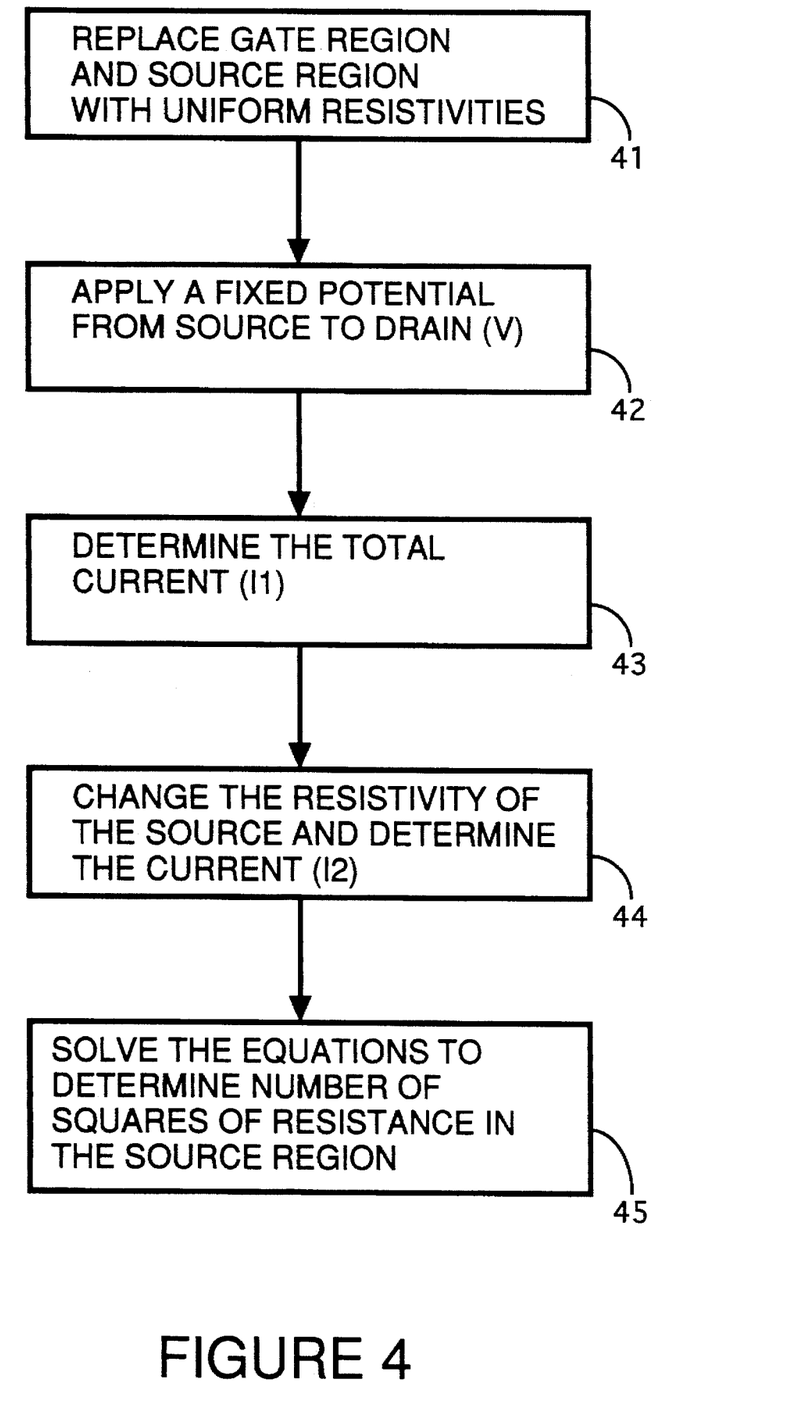
FIG. 4 shows steps of a method for determining source resistance within a transistor in accordance with the preferred embodiment of the present invention.

FIG. 4 shows steps of a method for determining source resistance. In a step 41, the substrate under transistor gate region 33 is modeled by an area of uniform resistivity ($\rho_g$). The transistor source region is modeled by an area of uniform resistivity ($\rho_{s1}$). In a step 42, a fixed potential (V) is applied from source region 31 to drain region 32.

In a step 43, the total current ($I_1$) is calculated from source region 31 to drain region 32. This total current may be calculated, for example using Laplace's equation. In two dimensions, Laplace's equation is as follows:

$$\left( \frac{\delta^2}{\delta x^2} + \frac{\delta^2}{\delta y^2} \right) \upsilon(x,y) = 0 \quad \text{Equation 1}$$

Where $\upsilon(x,y)$ is the potential as a function of the x and y coordinates. The electromagnetic field (E) has an x-component ($E_x$) and a y-component ($E_y$). These are determined from $\upsilon(x,y)$ as follows:

$$E = (E_x, E_y) = \left( -\frac{\delta}{\delta x} \theta, -\frac{\delta}{\delta y} \theta \right) \quad \text{Equation 2}$$

The components ($j_x, j_y$) of the current density (j) may be calculated from the electric field E by using equation 3 below:

$$j = (j_x, j_y) = \left( \frac{E_x}{\rho}, \frac{E_y}{\rho} \right) \quad \text{Equation 3}$$

When utilizing equation 3, $\rho$ equals $\rho_g$ for points within the gate region, and $\rho$ equals $\rho_{s1}$ for points within the source region.

Current continuity is demonstrated by equation 4 below:

$$\frac{\delta j_x}{\delta x} + \frac{\delta j_y}{\delta y} = 0 \quad \text{Equation 4}$$

In order to calculate the total current $I_1$, potential $\upsilon(x,y)$ is obtained, for example using equation 1. This may be done, for example, by solving equation 1, equation 2, equation 3 and equation 4 simultaneously using a standard numerical technique, e.g., finite element or finite difference. In the preferred embodiment, a grid size of one half the contact size was found sufficient to produce acceptable results. Thus for 0.8 micron technology which uses a 0.8 micron contact, the grid size used for the numeric calculations is 0.4 micron.

For further information on using such standard numerical techniques, see, for example, O. Zienkiewicz, *The Finite Element Method*, third edition, McGraw Hill, 1977; Garrett Birkhoff and Robert E. Lynch, *Numerical Solution of Elliptic Problems*, SIAM, Philadelphia, 1984; Klaus-Jurgen Bathe, *Finite Element Procedures in Engineering Analysis*, Prentice-Hall, Inc., 1982; O. Axelsson, V. A. Barker, *Finite Element Solution of Boundary Value Problems*, Academic Press, Inc., 1984; O. E. Akcasu, J. I. Bouknight, T. Luich, R. Jerome, and S. Leibiger, *Three Dimensional Transient Simulation of Electro-Thermal Behavior in Semiconductor Devices and its Applications*, IEDM 1987, pp. 514–517; O. E. Akcasu, Hem Hingarh, Steve Martin and Robert A. Kertis, *Modeling of Delay and Crosstalk in Interconnects*, ISSCC88, Technical Digest, pp. 80–81; O. E. Akcasu, *Convergence Properties of Newton's Method for the Solution of the Semiconductor Transport Equations and Hybrid Solution Techniques for Multidimensional Simulation of VLSI Devices*, Solid-State Electronics, p. 319–328, Vol. 27, No. 4, April 1984.

From the potential $\upsilon(x,y)$, the electric field E and the current density j may be found. The total current $I_1$ is then calculated in terms of the current density by calculating the current into or out of each contact in the source region (or by calculating the current into or out of each contact in the drain region) by integrating the normal component of the current density around the boundary of that contact. The results for all the source contacts (or alternately, all drain contacts) are summed to produce the total current.

In a step 44, the resistivity of the source region is changed to a second resistivity ($\rho_{s2}$) and the current is again calculated from source region 31 to drain region 32. This may again be done using Laplace's equation as described above.

In a step 45, the number of squares of resistance in the source region is calculated. This is calculated, for example, as follows. The total resistance ($R_t$) of the transistor is the sum of the resistance through source region 31 ($R_s$) and the resistance through drain region 32 ($R_d$) and the resistance under gate region 33 ($R_g$), as summarized by equation 5 below:

$$R_t = R_g + R_d + R_s \qquad \text{Equation 5}$$

The total resistance ($R_t$) also is equal to the fixed potential (V) applied from source region 31 to drain region 32 divided by the total current (I) from source region 31 to drain region 32, as summarized by equation 6 below:

$$\frac{V}{I} = R_t = R_g + R_d + R_s \qquad \text{Equation 6}$$

The resistance through source region 31 ($R_s$) is the product of the resistivity of the source area ($\rho_s$) and the number of squares of resistance in the source area ($N_s$), as summarized by equation 7 below:

$$R_s = N_s \rho_s \qquad \text{Equation 7}$$

Using equation 6 and equation 7, the total resistance using the current ($I_1$) and the source resistivity ($\rho_{s1}$) from step 43 is given by equation 8 below:

$$\frac{V}{I_1} = R_t = R_g + R_d + N_s \rho_{s1} \qquad \text{Equation 8}$$

Similarly, using equation 6 and equation 7, the total resistance using the current ($I_2$) and the source resistivity ($\rho_{s2}$) from step 44 is given by equation 9 below:

$$\frac{V}{I_2} = R_t = R_g + R_d + N_s \rho_{s2} \qquad \text{Equation 9}$$

Combining equation 8 and equation 9, the value for the number of squares of resistance in the source area ($N_s$) can be determined by Equation 10 below:

$$N_s = \frac{\frac{V}{I_1} - \frac{V}{I_2}}{\rho_{s1} - \rho_{s2}} \qquad \text{Equation 10}$$

From equation 7 above, the resistance through source region 31 ($R_s$) may then be calculated by multiplying the resistivity of the source area ($\rho_s$) times the number of squares of resistance in the source area ($N_s$).

In step 43 and step 44, the total current (I) from source region 31 to drain region 32 was determined. However, this was determined using an estimated value for gate resistivity ($\rho_g$). In reality, gate resistivity varies with the particular physical layout of the circuit and the voltages applied to the circuit.

For the purposes of the present invention, for calculation of the source resistance, the gate resistivity is chosen to be "much higher" than the source resistivity. However, if the gate resistivity is chosen to be too large, the calculation for the source resistivity can be skewed by numerical noise. Therefore, in the preferred embodiment of the present invention, it may be necessary to perform a number of iterations to insure that an appropriate value for gate resistivity is obtained before the source resistance is calculated.

Figure 5:
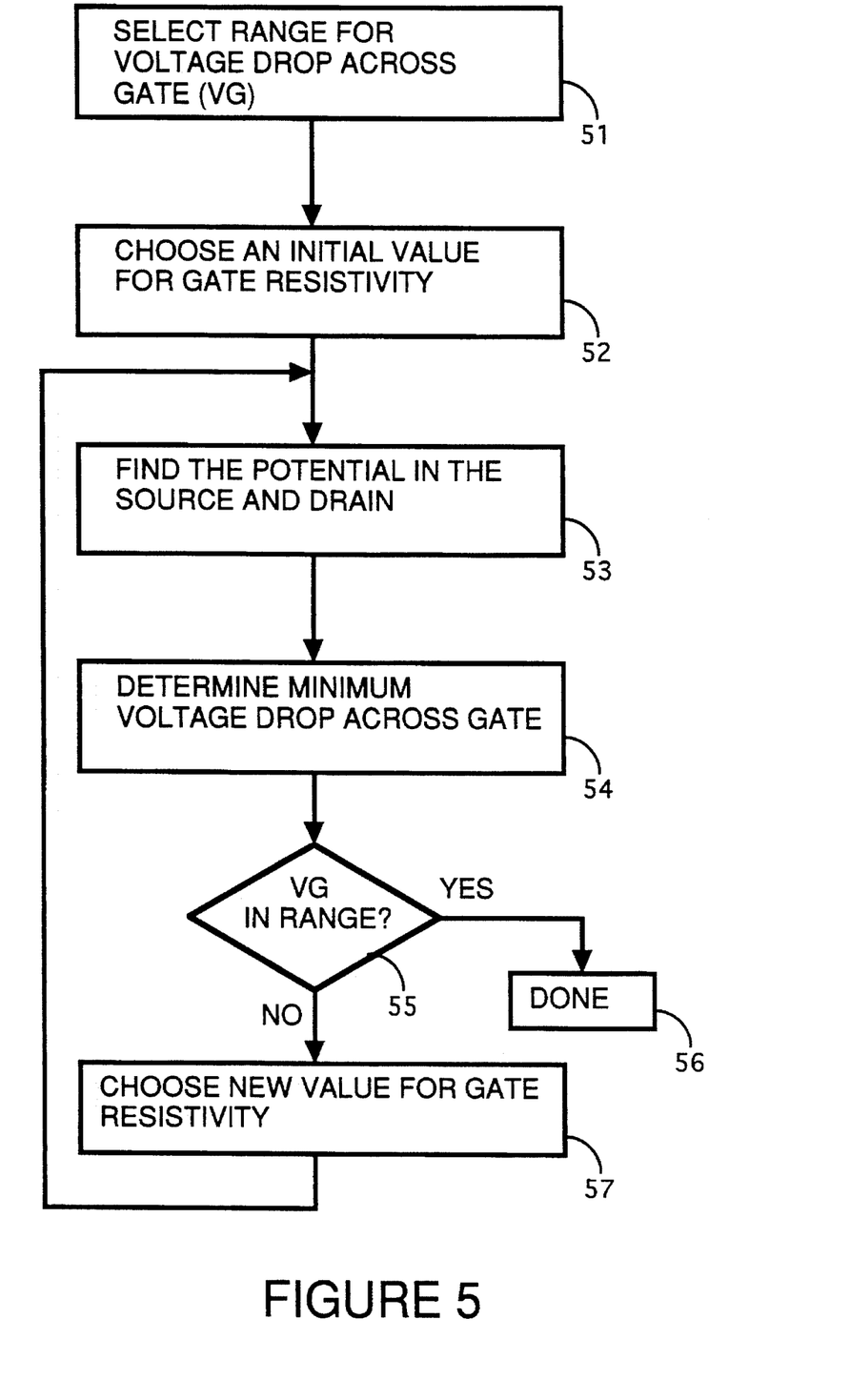
FIG. 5 shows steps of a method for obtaining gate resistivity in accordance with the preferred embodiment of the present invention.

FIG. 5 illustrates the necessary iterations to calculate the gate resistivity. In a step 51, an allowed range ($V_{min}$ to $V_{max}$) for the minimum voltage drop ($V_g$) across gate region 33 is determined. The allowed range ($V_{min}$ to $V_{max}$) will vary depending on, for example, processing variables and dimensions of the circuit. For example, for a particular set of circuits, the allowed range ($V_{min}$ to $V_{max}$) can be in the range of 80% to 90% of the fixed potential (V) applied from source region 31 to drain region 32. A target voltage drop ($V_{targ}$) is selected within the allowed range, for example as the mid voltage in the range. This is set out by Equation 11 below:

$$V_{targ} = \frac{(V_{min} + V_{max})}{2} \qquad \text{Equation 11}$$

In a step 52, an initial value of gate resistivity ($\rho_g$) is chosen. In a step 53 the potential is calculated. The potential $\upsilon(x,y)$ is obtained, for example using equation 1. This may be done, for example, by simultaneously solving equation 1, equation 2, equation 3 and equation 4 for the transistor using a standard numerical technique, e.g., finite element or finite difference, as discussed above.

In a step 54 the value for the minimum voltage drop ($V_g$) across gate region 33 is determined. Presuming the applied voltage is such that the drain contacts are at a higher potential than the source contacts, the minimum voltage drop ($V_g$) is found as follows. The solution for the potential $\upsilon(x,y)$ is examined to find the minimum value of the potential in the drain region ($V_{min, drain}$). The solution for the potential $\upsilon(x,y)$ is also examined to find the maximum value of the potential in the source region ($V_{max, source}$). The minimum voltage drop ($V_g$) is then obtained by subtracting the maximum value of the potential in the source region ($V_{max, source}$) from the minimum value of the potential in the drain region ($V_{min, drain}$).

In a step 55, it is checked whether the resultant minimum voltage drop ($V_g$) is within the range set in step 51. If so, in a step 56, the calculation is done. The resulting value of gate resistivity ($\rho_g$) is used to calculate the resistance through source region 31 ($R_s$) and the resistance through drain region 32 ($R_d$).

If, in step 55, the resultant minimum voltage drop ($V_g$) is not within the range set in step 51, in a step 57, a new value of gate resistivity (new $\rho_g$) is calculated using equation 12 below:

$$\text{new}\rho_g = \text{old}\rho_g \frac{V_{targ}}{V_g} \qquad \text{Equation 12}$$

After calculation of the new value of gate resistivity (new $\rho_g$), steps 53 through 55 are repeated using the new value of gate resistivity (new $\rho_g$).

The preferred embodiment is further illustrated by use of an example. In the example, the resistivity of the diffusion regions of the transistor are known from the doping level, substrate characteristics, etc., to be 80 ohms per square. That is, the uniform resistivity ($\rho_{s1}$) for the source region and the uniform resistivity ($\rho_{d1}$) for the drain region are both equal to 80 ohms per square. The fixed potential (V) applied from source region 31 to drain region 32 is selected to be one volt. The allowed range ($V_{min}$ to $V_{max}$) for the minimum voltage drop ($V_g$) across gate region 33 is selected to be in the range of 80% to 90% of the fixed potential (V) applied from source region 31 to drain region 32. That is, the allowed range ($V_{min}$ to $V_{max}$) for the minimum voltage drop ($V_g$) across gate region 33 is 0.8 volts to 0.9 volts. The target voltage drop ($V_{targ}$) is selected to be 85% of the fixed potential voltage, that is 0.85 volts.

For the first iteration, an initial value of gate resistivity ($\rho_g$) is chosen to be 2500 ohms per square. The potential $\upsilon(x,y)$ is obtained, for example using equation 1. This may be done, for example, by simultaneously solving equation 1, equation 2, equation 3 and equation 4 using a standard numerical technique, e.g., finite element or finite difference, as discussed above. The solution for the potential $\upsilon(x,y)$ is examined to find the minimum value of the potential in the drain region ($V_{min,\ drain}$). For the present example, the minimum value of the potential in the drain region ($V_{min,\ drain}$) is 0.09140 volts.

The solution for the potential $\upsilon(x,y)$ is also examined to find the maximum value of the potential in the source region ($V_{max,\ source}$). For the present example, the maximum value of the potential in the source region ($V_{max,\ source}$) is 0.05545 volts.

The minimum voltage drop ($V_g$) is then obtained by subtracting the maximum value of the potential in the source region ($V_{max,\ source}$) from the minimum value of the potential in the drain region ($V_{min,\ drain}$). This yields a value for the minimum voltage drop ($V_g$) of 0.03595 volts or approximately 3.6% of the fixed potential (V).

This is well outside the allowed range ($V_{min}$ to $V_{max}$) of 80% to 90% of the fixed potential (V). Therefore, using equation 12, a new value for value of gate resistivity ($\rho_g$) is calculated, as below:

$$\text{new}\rho_g = \text{old}\rho_g \frac{V_{targ}}{V_g} = 2500 \frac{\text{ohms}}{\text{square}} * \frac{.85V}{.03595V} = 59110 \frac{\text{ohms}}{\text{square}}$$

For the second iteration, the value of gate resistivity ($\rho_g$) is, therefore, 59,110 ohms per square. The potential $\upsilon(x,y)$ is obtained, for example, by simultaneously solving equation 1, equation 2, equation 3 and equation 4 using a standard numerical technique, e.g., finite element or finite difference, as discussed above. The solution for the potential $\upsilon(x,y)$ is examined to find the minimum value of the potential in the drain region ($V_{min,\ drain}$). For the present example, the minimum value of the potential in the drain region ($V_{min,\ drain}$) is 0.8150 volts.

The solution for the potential $\upsilon(x,y)$ is also examined to find the maximum value of the potential in the source region ($V_{max,\ source}$). For the present example, the maximum value of the potential in the source region ($V_{max,\ source}$) is 0.00283 volts.

The minimum voltage drop ($V_g$) is then obtained by subtracting the maximum value of the potential in the source region ($V_{max,\ source}$) from the minimum value of the potential in the drain region ($V_{min,\ drain}$). This yields a value for the minimum voltage drop ($V_g$) of 0.81217 volts or approximately 81.217% of the fixed potential (V).

This is within the allowed range ($V_{min}$ to $V_{max}$) of 80% to 90% of the fixed potential (V). Therefore, to calculate the value of the resistance through source region 31 ($R_s$) and the resistance through drain region 32 ($R_d$), gate resistivity ($\rho_g$), 59,110 ohms per square is used as the value of gate resistivity ($\rho_g$).

To obtain the value of the resistance through source region 31 ($R_s$), the total current ($I_1$) is calculated from source region 31 to drain region 32. This total current may be calculated, for example using Laplace's equation as discussed above. Using a uniform resistivity ($\rho_{s1}$) for the source region of 80 ohms per square, a uniform resistivity ($\rho_{d1}$) for the drain region 80 ohms per square and a uniform gate resistivity ($\rho_g$) of 59,110 ohms per square, the total current ($I_1$) is calculated to be 0.0006146 Amps.

The total current ($I_2$) is calculated from source region 31 to drain region 32. This may be done, for example using a uniform resistivity ($\rho_{s2}$) for the source region of 72.72 ohms per square, a uniform resistivity ($\rho_{d1}$) for the drain region 80 ohms per square and a uniform gate resistivity ($\rho_g$) of 59,110 ohms per square. Using the methodology described above, total current ($I_2$) is calculated to be 0.000621 Amps. The number of squares of resistance in the source area ($N_s$) is then calculated from equation 10 as follows:

$$N_s = \frac{\frac{V}{I_1} - \frac{V}{I_2}}{\rho_{s1} - \rho_{s2}} = \frac{\frac{1V}{.0006146A} - \frac{1V}{.000621A}}{80 \frac{\text{ohms}}{\text{square}} - 72.72 \frac{\text{ohms}}{\text{square}}} = 2.303 \text{ squares}$$

The resistance through source region 31 ($R_s$) is calculated by multiplying the resistivity of the source area ($\rho_{s1}$) (80 ohms/square) times the number of squares of resistance in the source area ($N_s$) (2.303 squares) to obtain the value of 184.24 ohms.

To obtain the value of the resistance through drain region 32 ($R_d$), the total current ($I_1$) is calculated from source region 31 to drain region 32. Using a uniform resistivity ($\rho_{s1}$) for the source region of 80 ohms per square, a uniform resistivity ($\rho_{d1}$) for the drain region 80 ohms per square and a uniform gate resistivity ($\rho_g$) of 59,110 ohms per square, the total current ($I_1$) is calculated to be 0.0006144 Amps.

The total current ($I_2$) is calculated from source region 31 to drain region 32. This may be done, for example using a uniform resistivity ($\rho_{s1}$) for the source region of 80 ohms per square, a uniform resistivity ($\rho_{d1}$) for the drain region 72.72 ohms per square and a uniform gate resistivity ($\rho_g$) of 59,110 ohms per square. Using the methodology described above, total current ($I_2$) is calculated to be 0.0006146 Amps. The number of squares of resistance in the drain area ($N_d$) is then calculated from equation 10 as follows:

$$N_d = \frac{\frac{V}{I_1} - \frac{V}{I_2}}{\rho_{d1} - \rho_{d2}} = \frac{\frac{1V}{.0006144A} - \frac{1V}{.0006146A}}{80 \frac{\text{ohms}}{\text{square}} - 72.72 \frac{\text{ohms}}{\text{square}}} = 0.073 \text{ squares}$$

The resistance through drain region 32 ($R_d$) is calculated by multiplying the resistivity of the drain area ($\rho_{d1}$) (80 ohms/square) times the number of squares of resistance in the drain area ($N_d$) (0.073 squares) to obtain the value of 5.84 ohms.

The foregoing discussion discloses and describes merely exemplary methods and embodiments of the present invention. As will be understood by those familiar with the art, the invention may be embodied in other specific forms without departing from the spirit or essential characteristics thereof. For example, the present invention may be implemented by a computer. Accordingly, the disclosure of the present invention is intended to be illustrative, but not limiting, of the scope of the invention, which is set forth in the following claims.

We claim:

1. A method for design of an integrated circuit comprising the steps of:
    (a) generating a physical layout for the integrated circuit; and,
    (b) estimating source resistance for a transistor within the physical layout for the integrated circuit, including the substeps of
        (b.1) modeling a substrate region under a gate for the transistor as a gate region having a uniform resistivity $\rho_g$,
        (b.2) modeling a source of the transistor as a source region having a uniform resistivity $\rho_{s1}$,
        (b.3) using the uniform resistivity $\rho_g$ and the uniform resistivity $\rho_{s1}$ to calculate a first current from the source of the transistor to a drain of the transistor, (b.4) modeling the source of the transistor as a source region having a uniform resistivity $\rho_{s2}$, wherein the uniform resistivity $\rho_{s2}$, is different in value than uniform resistivity $\rho_{s1}$, (b.5) using the uniform resistivity $\rho_g$ and the uniform resistivity $\rho_{s2}$ to calculate a second current from the source of the transistor to a drain of the transistor, and (b.6) using the uniform resistivity $\rho_{s1}$, the uniform resistivity $\rho_{s2}$, the first current and the second current to calculate the source resistance for the transistor.

2. A method as in claim 1 wherein in substep (b.3), the first current is calculated using Laplace's equation and wherein in substep (b.5), the second current is calculated using Laplace's equation, wherein Laplace's equation, in two dimensions, has a form as follows:

$$\left( \frac{\delta^2}{\delta x^2} + \frac{\delta^2}{\delta y^2} \right) \upsilon(x,y) = 0$$

where $\upsilon(x,y)$ is potential as a function of x and y coordinates.

3. A method as in claim 1 additionally comprising the step of:

(c) estimating drain resistance for a transistor within the physical layout for the integrated circuit, including the substeps of (c.1) modeling a drain of the transistor as a drain region having a uniform resistivity $\rho_{d1}$, (c.2) using the uniform resistivity $\rho_g$ and the uniform resistivity $\rho_{d1}$ to calculate a third current from the drain of the transistor to a drain of the transistor, (c.3) modeling the drain of the transistor as a drain region having a uniform resistivity $\rho_{d2}$, wherein the uniform resistivity $\rho_{d2}$, is different in value than uniform resistivity $\rho_{d1}$, (c.4) using the uniform resistivity $\rho_g$ and the uniform resistivity $\rho_{d2}$ to calculate a fourth current from the drain of the transistor to a drain of the transistor, and (c.5) using the uniform resistivity $\rho_{d1}$, the uniform resistivity $\rho_{d2}$, the third current and the fourth current to calculate the drain resistance for the transistor.

4. A method as in claim 3 wherein in step (b.3), the first current is calculated using Laplace's equation, in step (b.5), the second current is calculated using Laplace's equation, in step (c.2), the third current is calculated using Laplace's equation, in step (b.4), the fourth current is calculated using Laplace's equation, wherein Laplace's equation, in two dimensions, has a form as follows:

$$\left( \frac{\delta^2}{\delta x^2} + \frac{\delta^2}{\delta y^2} \right) \upsilon(x,y) = 0$$

where $\upsilon(x,y)$ is potential as a function of x and y coordinates.

5. A method as in claim 3 wherein in step (b.6) the source resistance ($R_s$) is calculated from the uniform resistivity $\rho_{s1}$, the uniform resistivity $\rho_{s2}$, the first current ($I_1$) and the second current ($I_2$) using a form of the following equation:

$$R_s = \frac{\frac{V}{I_1} - \frac{V}{I_2}}{\rho_{s1} - \rho_{s2}} \rho_{s1}$$

and wherein in step (c.5) the drain resistance ($R_d$) is calculated from the uniform resistivity $\rho_{d1}$, the uniform resistivity $\rho_{d2}$, the third current ($I_3$) and the fourth current ($I_4$) using a form of the following equation:

$$R_d = \frac{\frac{V}{I_3} - \frac{V}{I_4}}{\rho_{d1} - \rho_{d2}} \rho_{d1}.$$

6. A method as in claim 1, wherein substep (b.1) comprises the following substeps:

(b.1.1) using an initially selected uniform resistivity $\rho_g$, calculating the minimum voltage drop across the gate region; and (b.1.2) when the voltage drop across the gate region calculated in substep (b.1.1) is not within a predetermined range, selecting a new value for the uniform resistivity $\rho_g$ and repeating substep (b.1.1) and substep (b.1.2).

7. A method as in claim 6, wherein in substep (b.1.2) the new value for the uniform resistivity (new $\rho_g$) is calculated from the value for the initially selected uniform resistivity $\rho_g$, from the minimum voltage drop ($V_g$) across the gate region and from a target voltage ($V_{targ}$) within the predetermined range using the following equation:

$$\text{new}\rho_g = \rho_g \frac{V_{targ}}{V_g}.$$

8. A method as in claim 6 wherein substep (b.1.1) includes the following substeps:

(b.1.1.1) calculating a maximum value of potential in the source region and a minimum value of potential in the drain region; and, (b.1.1.2) subtracting the maximum value of potential in the source region from the minimum value of potential in the drain region to obtain the minimum voltage drop ($V_g$) across the gate region.

9. A method as in claim 8 wherein in substep (b.1.1.1) the maximum value of potential in the source region and the minimum value of potential in the drain region are obtained using Laplace's equation, wherein Laplace's equation, in two dimensions, has a form as follows:

$$\left( \frac{\delta^2}{\delta x^2} + \frac{\delta^2}{\delta y^2} \right) \upsilon(x,y) = 0$$

where $\upsilon(x,y)$ is potential as a function of x and y coordinates.

10. A method as in claim 3 additionally comprising the following step:

(d) manufacturing the integrated circuit.

11. A method as in claim 1 additionally comprising the following step:

(c) manufacturing the integrated circuit.

12. A method as in claim 1 wherein in step (b.6) the source resistance ($R_s$) is calculated from the uniform resistivity $\rho_{s1}$, the uniform resistivity $\rho_{s2}$, the first current ($I_1$) and the second current ($I_2$) using a form of the following equation:

$$R_s = \frac{\frac{V}{I_1} - \frac{V}{I_2}}{\rho_{s1} - \rho_{s2}} \rho_{s1}.$$

13. A method for design of an integrated circuit comprising the steps of:
 (a) generating a physical layout for the integrated circuit;
 (b) modeling a substrate region under a gate for the transistor as a gate region having a uniform resistivity $\rho_g$;
 (c) selecting a voltage range for a voltage drop across the gate region;
 (d) selecting a first value for the uniform resistivity $\rho_g$;
 (e) using a preselected value for source resistivity, a preselected value for drain resistivity, and the first value for the uniform resistivity $\rho_g$ to calculate the voltage drop across the gate region;
 (f) when the voltage drop across the gate region calculated in step (e) is not within the voltage range, selecting a new value for the uniform resistivity $\rho_g$ and repeating step (e);
 (g) calculating source resistance; and,
 (h) calculating drain resistance for the transistor.

14. A method as in claim 13 wherein step (g) includes the following substeps:
 (g.1) modeling a source of the transistor as a source region having a uniform resistivity $\rho_{s1}$;
 (g.2) using the uniform resistivity $\rho_g$ and the uniform resistivity $\rho_{s1}$ to calculate a first current from the source of the transistor to a drain of the transistor;
 (g.3) modeling the source of the transistor as a source region having a uniform resistivity $\rho_{s2}$, wherein the uniform resistivity $\rho_{s2}$, is different in value than uniform resistivity $\rho_{s1}$;
 (g.4) using the uniform resistivity $\rho_g$ and the uniform resistivity $\rho_{s2}$ to calculate a second current from the source of the transistor to a drain of the transistor; and,
 (g.5) using the uniform resistivity $\rho_{s1}$, the uniform resistivity $\rho_{s2}$, the first current and the second current to calculate the source resistance for the transistor.

15. A method as in claim 14 wherein in substep (g.2), the first current is calculated using Laplace's equation and wherein in substep (g.4), the second current is calculated using Laplace's equation, wherein Laplace'S equation, in two dimensions, has a form as follows:

$$\left( \frac{\delta^2}{\delta x^2} + \frac{\delta^2}{\delta y^2} \right) \upsilon(x,y) = 0$$

where $\upsilon(x,y)$ is potential as a function of x and y coordinates.

16. A method as in claim 13 wherein step (f) includes the following substeps:
 (h.1) modeling a drain of the transistor as a drain region having a uniform resistivity $\rho_{d1}$;
 (h.2) using the uniform resistivity $\rho_g$ and the uniform resistivity $\rho_{d1}$ to calculate a third current from the drain of the transistor to a drain of the transistor;
 (h.3) modeling the drain of the transistor as a drain region having a uniform resistivity $\rho_{d2}$, wherein the uniform resistivity $\rho_{d2}$, is different in value than uniform resistivity $\rho_{d1}$;
 (h.b 4) using the uniform resistivity $\rho_g$ and the uniform resistivity $\rho_{d2}$ to calculate a fourth current from the drain of the transistor to a drain of the transistor; and,
 (h.5) using the uniform resistivity $\rho_{d1}$, the uniform resistivity $\rho_{d2}$, the third current and the fourth current to calculate the drain resistance for the transistor.

17. A method as in claim 16 wherein in substep (h.2), the third current is calculated using Laplace's equation and wherein in substep (h.4), the fourth current is calculated using Laplace's equation, wherein Laplace's equation, in two dimensions, has a form as follows:

$$\left( \frac{\delta^2}{\delta x^2} + \frac{\delta^2}{\delta y^2} \right) \upsilon(x,y) = 0$$

where $\upsilon(x,y)$ is potential as a function of x and y coordinates.

18. A method as in claim 13, wherein in step (f) the new value for the uniform resistivity (new $\rho_g$) is calculated from the value for the uniform resistivity $\rho_g$, from a minimum voltage drop ($V_g$) across the gate region and from a target voltage ($V_{targ}$) within the voltage range using the following equation:

$$\text{new } \rho_g = \rho_g \frac{V_{targ}}{V_g}.$$

19. A method as in claim 13 additionally comprising the following step:
 (i) manufacturing the integrated circuit.

* * * * *